US006896552B2

United States Patent
Kosmala

(12) United States Patent
(10) Patent No.: US 6,896,552 B2
(45) Date of Patent: May 24, 2005

(54) FILTERED CONNECTOR

(75) Inventor: Michael Lawrence Kosmala, Mission Viejo, CA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 88 days.

(21) Appl. No.: 10/430,933

(22) Filed: May 6, 2003

(65) Prior Publication Data

US 2004/0224560 A1 Nov. 11, 2004

(51) Int. Cl.[7] .............................................. H01R 13/66
(52) U.S. Cl. ....................................................... 439/620
(58) Field of Search ........................... 439/621, 75, 74; 361/749

(56) References Cited

U.S. PATENT DOCUMENTS 5,754,409 A * 5/1998 Smith .......................... 361/803
6,201,689 B1 * 3/2001 Miyasyo ...................... 361/681
6,236,565 B1 * 5/2001 Gordon ........................ 361/695
2001/0009816 A1 * 7/2001 Durr et al. ................... 439/181

FOREIGN PATENT DOCUMENTS

GB      2086151      * 6/1982      .......... H01R/13/66

* cited by examiner

Primary Examiner—J. F. Duverne
(74) Attorney, Agent, or Firm—Roger C. Turner

(57) ABSTRACT

A filtered connector with multiple pin contacts (14) connected to ground by Pi filters, which can be constructed at low cost. Two circuit board portions (24, 26) that are spaced apart by ferrite beads (40), are portions of a single flexible circuit board (50) that are connected together by a loop portion (52) of the circuit board. A ground plane (100) of the circuit board is connected to a metal shell (130) that surrounds the circuit boards and pins, by bending peripheral portions (140, 142) of the circuit board as it is pressed into the shell and soldering the peripheral portions to the shell. Each of the pins is connected to a signal trace (80, 82) on the circuit board by the hole edge of each circuit board being deflected out of its original plane by the pin, to assure the flow of solder between the signal trace and the pin.

11 Claims, 4 Drawing Sheets

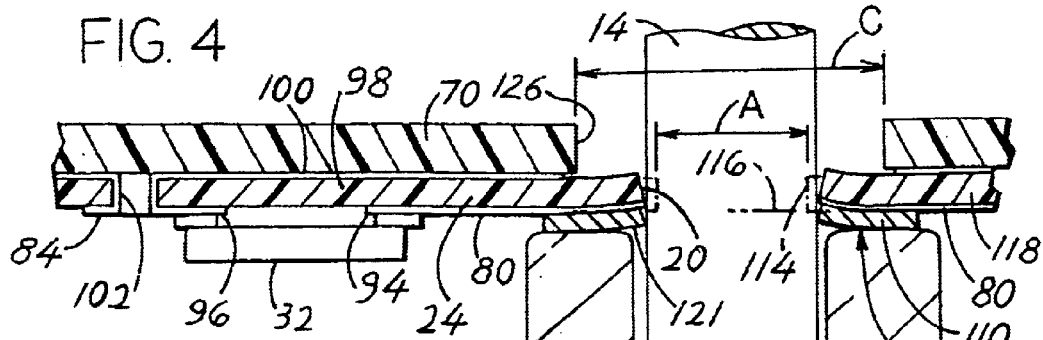
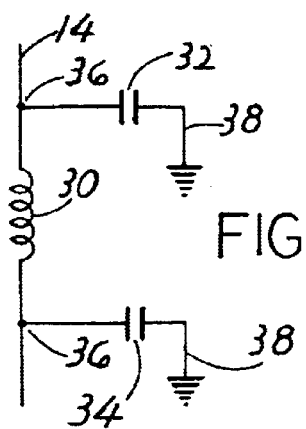
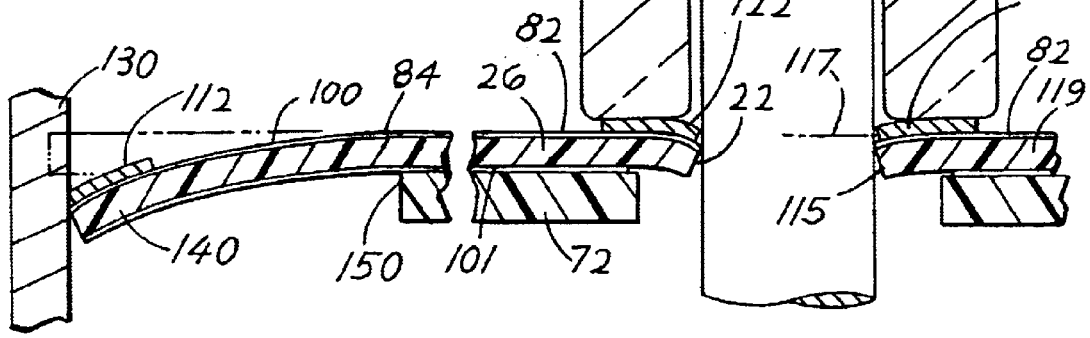
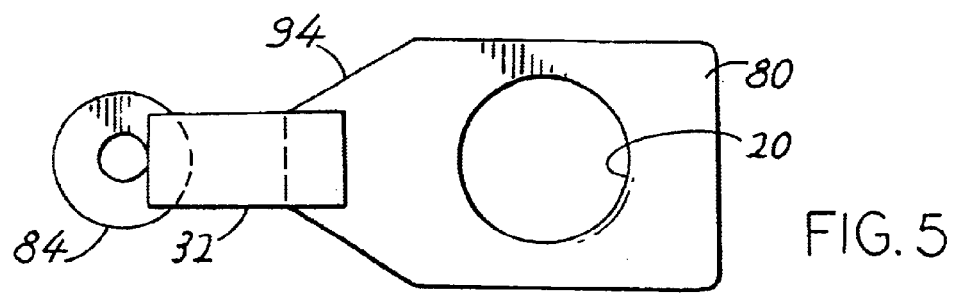

FILTERED CONNECTOR

BACKGROUND OF THE INVENTION

One type of filtered connector includes a plurality of pin contacts that project through holes in circuit boards and through holes in ferrite beads that separate the circuit boards. One or more capacitors on each board provide the capacitors of a Pi filter for each contact. Signal traces on each board must be soldered to the pin contacts. This has been accomplished by hand threading tiny solder rings around each pin until it lies against a signal trace, for vapor phase soldering, which involves considerable hand labor. The ground planes of the two circuit boards can be connected together and to a metal shell by a separate deflectable contactor, but this involves additional labor and parts. A filtered connector of simple and low cost design, would be of value.

SUMMARY OF THE INVENTION

In accordance with one embodiment of the present invention, a filtered connector is provided, of the type that has a pair of spaced parallel circuit board portions with aligned holes that receive pin contacts, and that connect the pin contacts to filtering components, and a ground plane to a shell, which can be constructed at low cost. The two circuit board portions that lie in parallel planes, are parts of a single flexible circuit board which includes a loop portion that extends in a 180° loop to connect the board portions. Each board portion has signal traces that surround each hole and has ground traces, with filter components such as capacitors each soldered to a signal trace and to a ground trace. Each signal trace has walls at a pin-receiving hole, wherein the hole walls are bent out of the plane of the rest of the circuit board portion by the pin and are covered by a solder layer, to facilitate soldering to the pin. The periphery of at least one board portion is plated by a portion of a ground plane and is also deflected out of the plane of most of the board portion by the metal shell that surrounds the board portions and pins, and that is soldered to the shell.

The novel features of the invention are set forth with particularity in the appended claims. The invention will be best understood from the following description when read in conjunction with the accompanying drawings.

BRIEF DESCRIPTION OF THE DRAWINGS

FIG. 3 is a schematic diagram of one of the Pi filters of the connector.

FIG. 4 is an enlarged sectional view of a portion of the connector of FIG. 1.

FIG. 5 is a plan view of only a signal trace, a ground trace, and a capacitor of the connector portion of FIG. 4.

DESCRIPTION OF THE PREFERRED EMBODIMENTS

Figures 1, 2:
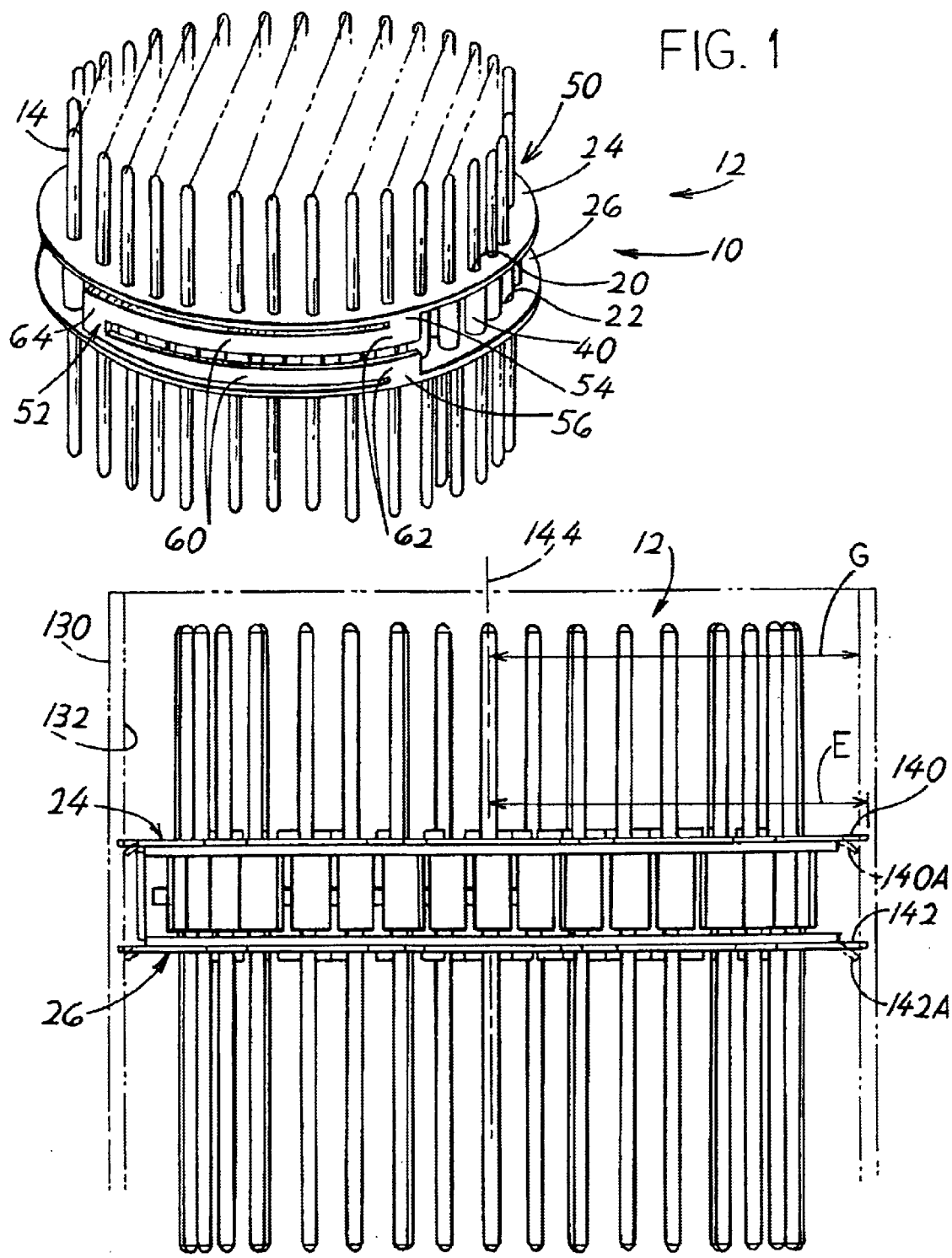
FIG. 1 is an isometric view of a main portion of a filtered connector, shown without the surrounding shell.
FIG. 2 is a side elevation view of the connector of FIG. 2, a portion of the shell being shown in phantom lines and a portion of the circuit board periphery shown in phantom lines when it is deflected by the shell.

FIG. 1 illustrates a major portion 10 of a filtered connector 12, which includes numerous rows of pin contacts 14. By "pin contacts" applicant means that the contact has at least one end in the form of a male contact or pin. The pin contacts project through holes 20, 22 in each of two primarily flat circuit board portions, including a first or upper board portions 24 and a second or lower board portion 26. The connector is a filtered connector, wherein the connector provides a filter for each of the numerous pin contacts 14. Each filter is of the Pi type illustrated in FIG. 3, wherein an inductor 30 is coupled to the pin contact 14 and a pair of capacitors 32, 34 are also connected to the pin. Each capacitor has one end 36 connected to pin locations on opposite sides of the inductor, and each capacitor has an opposite end 38 that is grounded. FIG. 1 shows ferrite beads 40 that form the inductors.

In the prior art, the upper and lower flat board portions 24, 26 were each formed of a separate piece of rigid circuit board, the two board pieces being separated by the numerous ferrite beads 40. In the present invention, applicant constructs the upper and lower board portions 24, 26 as parts of a single flexible circuit board 50. Applicant notes that such flexible circuit board is often referred to as a flexible circuit; applicant adds the word "board" to show that the flexible circuit includes a flexible substrate (flexible "board") which carries signal traces and other circuit portions. The flexible circuit board has a loop portion 52 that extends in a 180° loop, with loop ends 54, 56 that connect to the upper and lower circuit boards. The loop portion has parallel loop parts 60 with proximal ends 62 that connect to the loop ends 54, 56 and with distal ends 64 that are connected together. The elongated parallel parts 60 enable the board portions 24, 26 to be moved slightly closer together or further apart without appreciable deflection of the flexible circuit board portions from their intended configurations.

FIG. 4 shows one of the pin contacts 14 and the upper and lower or first and second flat circuit board portions 24, 26. A stiffener 70, 72 supports each flexible board portion so it lies largely in a single plane. Each board portion such as 24 has signal traces 80, 82 that extend around each pin-receiving hole 20, 22. Each circuit board also has ground traces 84 that are spaced from the holes. Capacitors such as 32 extend between ends 94, 96 of the signal and ground traces 80, 84 and are soldered to them. The signal and ground traces lie on a resiliently flexible dielectric substrate 98. A ground plane 100 lies at one face of each board portion opposite the signal traces, and is connected through plated-through holes 102 to the ground traces 84. Although FIG. 4 shows the circuit board portions 24, 26 lying substantially against the ferrite bead 40, there can be a greater spacing between the upper and lower board portions.

The connection of the signal traces 80, 82 of the two board portions to the pin contact 14, has previously been a difficult procedure. Previously, small beads of solder were placed around the pin and against signal traces on the circuit board, and the connector was heated to melt the solder. The placement of numerous tiny solder beads around the pin contacts was done by hand, and is very time consuming. In accordance with the present invention, applicant places a layer 111 of solder, with upper and lower solder layer portions 110, 112, over selected trace portions on the circuit board. This can be done by screening on the solder layer portions in a single operation. This results in a solder layer of largely uniform thickness that adheres to the signal traces prior to the soldering operation. Such screened on solder layer can be readily distinguished from other solder-applied layers, such as tiny rings lying around the pins. The pin-receiving holes 20, 22 in each board portion 24, 26 each has a diameter A which is slightly less than the diameter B of the pin 14. As a result, the walls of each pin-receiving hole lies in an interference fit with the pin. Since the flexible circuit board is thin and highly flexible, the walls of a pin-receiving holes such as 20 are deflected to expand from diameter A to the pin diameter B. The edges 114, 115 of the deflected flexible board portions are deflected out of the planes 116, 117 of the surrounding board main regions 118, 119 (by at least 10% of board thickness). By use of a deflectable flexible circuit board, a larger interference fit is acceptable between the pin-receiving holes and the pins.

The solder around the holes, at the upper and lower solder layer portions 110, 112 both lie directly against the pin. When the solder is melted during vapor phase soldering, the solder flows along the pin without having to cross a gap, and then forms a good solder connection between the pin and circuit board signal trace. It is noted that the solder compositions 110, 112 are formed of both solder and flux, so a solder connection is made when the solder composition is melted.

The connector is carefully constructed and assembled to assure that the screened-on solder layer portions 110, 112 of FIG. 4 lie against the pin 14. First, the lower circuit board portion 26 with stiffener 72 is laid on a support that has holes that pass the pin lower ends. Then, the pins 14 are forced down through the lower holes 22, with the solder lying in the upper face of the lower board portion 26 and extending to the hole edge. Board deflection presses the solder layer portion 112 tightly against the pin. The ferrite beads 40 have been placed or are placed around the pins. Then, the upper board portion 24 is pressed down around the pins, causing upward deflection of the upper board portion that presses the upper solder layer portion 110 tightly against the pins. Each board portion surrounding a pin has a convex surface 121, 122, and an opposite concave surface, the solder layer portions each lying on a convex surface.

Both the stiffeners 70, 72 and the ground planes 100, 101 have holes 126 of much larger hole diameter C than the hole diameter A in the circuit board portions. This permits flexing of the circuit board and also keeps the ground plane away from the solder connections of the pin to the signal traces. FIG. 5 shows the shape of a signal trace 80, a ground trace 84, and a capacitor 32.

FIG. 2 shows that the entire connector includes a shell 130 that is usually formed of a metal and that in any case has a conductive inner surface 132. The ground plane of the flexible circuit board must be connected in a low resistance connection to the conductor inner surface 132. In the prior art, this was generally done by fastening a contactor in the form of a ring with a resiliently outwardly-bulging middle, so it pressed against the inner surface 132 of the shell. Applicant establishes a low resistance electrical connection between the circuit board ground plane and the shell by extending the ground plane to the periphery of the board portions 24, 26, and using the rigid shell 130 to deflect the peripheral parts 140, 142. There is an interference fit of the board peripheral parts with the shell inner surface. That is, the radial distance E of the periphery of each undeflected board portion extends further from the axis 144 of the connector main portion 12, than the distance G of the inner surface 132 of the shell from the axis. If the shell is moved downward D, the peripheral portions 140, 142 will be deflected to positions such as 140A, 142A. With solder layers extending to the periphery of the board peripheral parts, subsequent heating of the connector causes the solder to flow and form a solder connection between the peripheries of the board portions and the inner surface 132 of the shell.

FIG. 4 shows that the peripheral parts 140 of the flexible circuit board are deflected by the shell 130, and such deflection assures an interference fit with the shell 130. This occurs without very tight tolerances on the outside diameter of the circuit board, since the radius of the peripheral portion decreases as it deflects. In such deflections, the circuit board deflects vertically V, usually by at least half its thickness. It is noted that the stiffener 72 has an outer end 150 that is spaced from the periphery, to enable such bending of the periphery. It is noted that the vertical direction V is used only to show the relative positions of the parts, and the connector can be used in any orientation. The solder layer 112 on the lower board portion moves tightly against the shell and readily solders to the shell.

Figure 6:
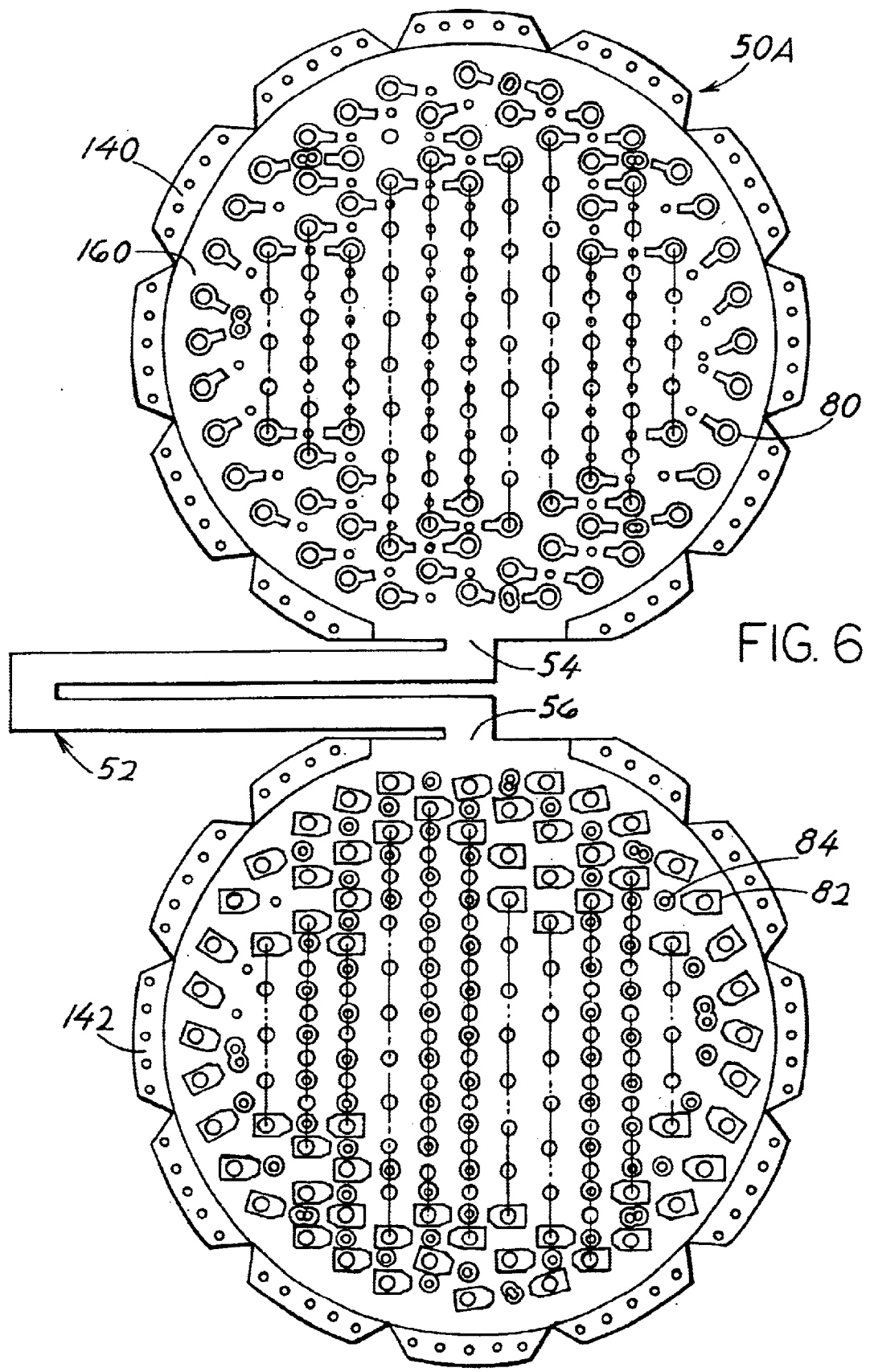
FIG. 6 is a plan view of the flexible circuit board of the connector of FIG. 1, showing only the capacitor face of the board and showing it prior to folding it to the configuration shown in FIG. 1.
Figure 7:
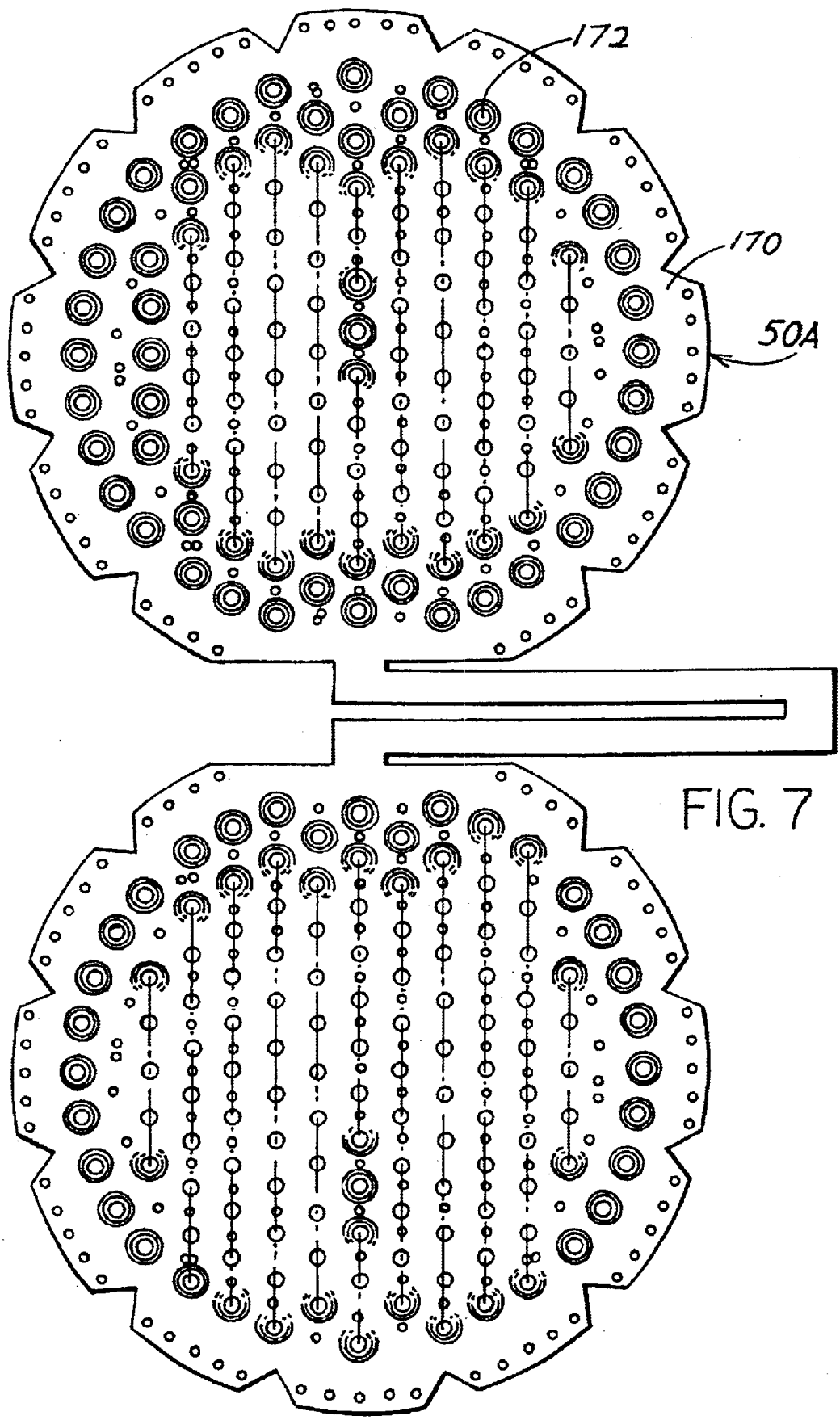
FIG. 7 is a plan view of the circuit board of FIG. 6, but showing its opposite face which contains a ground plane.

FIG. 6 shows the capacitor face 160 of the flexible circuit board 50A before the loop portion 52 is bent by two 90° bends at the loop ends 54 and 56. The ground plane covers the opposite, ground face of the circuit board, but also covers the peripheral portions 140, 142 even on the capacitor side of the circuit board. The particular circuit board shown is designed to receive 168 contact pins. It is noted that the shapes of the signal terminals 80, 82 are somewhat different at different sides of the circuit board. FIG. 7 shows the shape of the ground plane face 170 of the circuit board. The ground plane face is completely covered with a layer that is electrically grounded, except near pin-receiving holes 172 that the pins pass through. The ground plane of the face 170 extends to the peripheral portion of the opposite capacitor face.

In a connector of the type illustrated that applicant has designed, the first and second circuit board portions each have an outside diameter of 1.37 inch, with each pin-receiving hole having an initial diameter A (FIG. 4) of 0.035 inch. The circuit board had a thickness of 5 mils (1 mil equals one thousandth inch) and was formed of Kapton with the traces formed of copper. The stiffeners had a thickness of 20 mils. The solder layers 110, 112 had a thickness of about 5 mils.

Thus, the invention provides a filtered connector having a pair of spaced circuit board portions with pin-receiving holes and with traces that connect to circuit components, which is of an improved construction. The circuit board portions are formed by a single flexible circuit board with a loop portion that extends in a 180° loop (two 90° bends) that connects the two flexible circuit board portions. The ground planes of the board portions are connected together through the loop portion of the flexible circuit board. The periphery of the ground plane is electrically connected to a shell by a large interference fit between the periphery of the board portions and the inner surface of the shell, which is made possible by resilient deflection of the periphery of the board portions, which are later soldered to the shell. Deflection of the walls of the pin-receiving holes of the circuit board enables connection to the pins with a large interference fit. A solder layer is laid on traces of the circuit board, with solder layer portions at the pin-receiving holes extending up to the edges of the hole and deflected tightly against the pins to assure reliable solder connection to the pins. A stiffener stiffens each circuit board portion, but each stiffener has a larger hole than the hole in the circuit board around each pin-receiving hole, and the stiffener does not support the periphery of the board portions, in order to allow them to deflect.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A filtered connector which includes a pair of primarily flat circuit board portions lying in spaced parallel planes and having multiple aligned pairs of pin-receiving holes with each pin-receiving hole of a pair lying in a different one of said circuit board portions, each circuit board having a conductive trace lying at each of said holes, and said connector has multiple contacts each having a pin portion projecting through a pair of said pin-receiving holes and soldered to the corresponding traces, including:

a flexible circuit board that has a loop portion folded by 180° and that has first and second flexible board portions that form said pair of flat circuit board portions, said loop portion connecting said flexible board portions.

2. The connector described in claim 1 including:

a shell with a conductive inner surface that has an axis and that surrounds said flexible circuit board, said shell inner surface radially spaced a predetermined first distance from said axis;

at least said first flexible board portion has a main region that extends in a plane and has a peripheral part, and said flexible circuit board has a ground trace with a portion lying on said peripheral parts;

the peripheral part of said first flexible board portion initially extends a second distance from said axis that is greater than said first distance, but said peripheral part is deflected by said shell to extend at an incline from the plane of said first flexible board portion main region, and is soldered to said shell.

3. The connector described in claim 2 including:

a pair of plate-like stiffeners each fixed to one of said flexible board portions, including a first stiffener having about the same size and shape as said first flexible board portion, as seen in a plan view, but said peripheral part of said first flexible board portion extends radially beyond a periphery of said first stiffener.

4. The connector described in claim 1 wherein:

at each of said pin-receiving holes in said flexible board portions, the trace that lies at the hole is in the form of a film that extends around the hole and that extends to the edge of the hole but not within the hole.

5. The connector described in claim 1 including:

a pair of plate-like stiffeners each fixed to one of said flexible board portions; and at least a first of said stiffeners has holes aligned with said pin-receiving holes in said first flexible board portion, but said holes in said first stiffener are of greater diameter than said pin-receiving holes in said first flexible board portion, to thereby allow free flexing of the flexible board portion at each hole.

6. The connector described in claim 1 including:

a layer of solder composition lying on selected areas of said circuit board, including pin-soldering portions each lying around each of said pin-receiving holes and extending to the inner edge of the hole, each board portion that surrounds a hole ane that includes the hole edge being deflected by a pin portion and forming a concave surface and an opposite convex surface, and the pin soldering portions lying on a convex surface.

7. The connector described in claim 1 wherein:

said flexible board portions are vertically spaced;

said loop portion has opposite top and bottom loop ends that each merges with one of said flexible board portions, and said loop portion includes a pair of horizontal parallel parts, said loop ends each extends largely vertically from one of said flat circuit board portion to a proximal end of one of said parallel parts, and said parallel parts have distal ends that lie opposite said proximal ends and that are joined together.

8. A filtered connector which includes first and second circuit board portions lying in spaced parallel planes and having multiple pairs of aligned holes, each circuit board portion having a plurality of signal traces each surrounding one of the board portion holes and each circuit board portion having a plurality of ground traces, the connector including a plurality of pin contacts each extending through a pair of said holes, a plurality of ferrite beads each surrounding one of said pin contacts and lying between said circuit board portions, and a plurality of capacitors each having one terminal connected to one of said signal traces and another terminal connected to one of said ground traces, wherein:

said first and second circuit board portions are each a flexible circuit board portion, that each includes a flexible dielectric substrate and that includes said signal and ground traces on at least a first side of the substrate;

a layer of solder lying on portions of said signal traces that surround each of said holes;

portions of said circuit board that surround each of said holes, lie in interference fits with said pins and are deflected out of a plane of a portion of the board that is spaced from the hole.

9. The connector described in claim 8 including:

a shell that surrounds said circuit board portions and that has an electrically conductive inner surface with an axis;

at least a first of said circuit board portions has a grounded metal coated peripheral part that lies in an interference fit with said shell inner surface and that is bent by contact with the shell.

10. The connector described in claim 8 including;

a flexible circuit board that forms said first and second circuit board portions, and that forms a loop portion that extends in a 180° loop and that connects said circuit board portions so inner faces of said board portions face each other, said board portions having inner faces with said signal and ground traces lying thereon, and said flexible circuit board has a ground plane that covers said outer faces of said board portions and said loop portion, said board portions have plated ground holes that merge with said ground plane on said inner face and with said ground traces on said outer faces of said board portions.

11. The connector described in claim 8 wherein:

said first and second circuit board portions have surfaces that face each other, said signal traces lie on said surfaces that face each other, and said layer of solder lies on said signal traces that lie on said surfaces that face each other, and said layer of solder extends to the edge of each hole that receives a pin;

the edges at two of said holes that receive the same pin being deflected away from each other, whereby to press the portion of each solder that surrounds a hole against the pin extending through the hole.

\* \* \* \* \*